United States Patent
Mueller et al.

(10) Patent No.: US 11,228,161 B2
(45) Date of Patent: Jan. 18, 2022

(54) SEMICONDUCTOR LASER ARRAY AND SEMICONDUCTOR LASER ARRAY CIRCUIT ARRANGEMENT

(71) Applicant: Osram OLED GmbH, Regensburg (DE)

(72) Inventors: Martin Mueller, Bernhardswald (DE); Guenther Groenninger, Seubersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 62 days.

(21) Appl. No.: 16/757,774

(22) PCT Filed: Oct. 25, 2018

(86) PCT No.: PCT/EP2018/079312
§ 371 (c)(1),
(2) Date: Apr. 21, 2020

(87) PCT Pub. No.: WO2019/081653
PCT Pub. Date: May 2, 2019

(65) Prior Publication Data
US 2020/0321753 A1    Oct. 8, 2020

(30) Foreign Application Priority Data
Oct. 27, 2017  (DE) .................. 10 2017 125 237.1

(51) Int. Cl.
*H01S 5/00*    (2006.01)
*H01S 5/30*    (2006.01)
(Continued)

(52) U.S. Cl.
CPC ............ *H01S 5/3095* (2013.01); *H01S 5/042* (2013.01); *H01S 5/0425* (2013.01);
(Continued)

(58) Field of Classification Search
CPC .... H01S 5/4043; H01S 5/0425; H01S 5/3054; H01S 5/3095; H01S 5/026; H01S 5/042
See application file for complete search history.

(56) References Cited

U.S. PATENT DOCUMENTS

| 5,212,706 A | 5/1993 | Jain |
| 5,814,841 A * | 9/1998 | Kusuda ...................... B41J 2/45 224/238 |

(Continued)

FOREIGN PATENT DOCUMENTS

| DE | 102009054564 A1 | 6/2011 |
| DE | 102016125430 A1 | 6/2018 |

(Continued)

OTHER PUBLICATIONS

International Search Report issued for the corresponding PCT-application No. PCT/EP2018/079312, dated Feb. 5, 2019, 2 pages (for informational purpose only).

(Continued)

*Primary Examiner* — Kinam Park
(74) *Attorney, Agent, or Firm* — Viering, Jentschura & Partner mbB (57) ABSTRACT

A semiconductor laser array may include a plurality of semiconductor lasers and a common substrate configured as a common anode of said plurality of semiconductor lasers. Each semiconductor laser may have a pn junction region between the common anode and a cathode contact layer. The pn junction region may include a p-doped layer and an n-doped layer. The p-doped layer of the pn junction region may face the substrate. The semiconductor laser array circuit arrangement may include a semiconductor laser array, each laser may be controlled by a driver with an n-MOSFET.

12 Claims, 6 Drawing Sheets

(51) Int. Cl.
*H01S 5/042* (2006.01)
*H01S 5/40* (2006.01)
H01S 5/026 (2006.01)

(52) U.S. Cl.
CPC .......... *H01S 5/3054* (2013.01); *H01S 5/4043* (2013.01); *H01S 5/026* (2013.01)

(56) References Cited

U.S. PATENT DOCUMENTS

| | | | |
|---|---|---|---|
| 2006/0291512 A1 | 12/2006 | Borschowa | |
| 2008/0310471 A1* | 12/2008 | Bessho | H01S 5/4043 372/44.01 |
| 2012/0287958 A1* | 11/2012 | Lell | H01S 5/4043 372/45.01 |
| 2016/0072253 A1 | 3/2016 | Kadoya | |
| 2019/0025406 A1* | 1/2019 | Krelboim | H01S 5/183 |
| 2020/0067270 A1* | 2/2020 | Muller | H01S 5/0428 |
| 2020/0278426 A1* | 9/2020 | Dummer | G01S 7/4815 |
| 2020/0388988 A1* | 12/2020 | Enzmann | H01S 5/0202 |

FOREIGN PATENT DOCUMENTS

| | | |
|---|---|---|
| DE | 102017108385 A1 | 10/2018 |
| WO | 2017025958 A1 | 2/2017 |

OTHER PUBLICATIONS

German Search Report issued for the corresponding DE-application No. 10 2017 125 237.1, dated Aug. 7, 2018, 6 pages (for informational purpose only).

\* cited by examiner

FIG 9

US 11,228,161 B2

SEMICONDUCTOR LASER ARRAY AND SEMICONDUCTOR LASER ARRAY CIRCUIT ARRANGEMENT

CROSS-REFERENCE TO RELATED APPLICATIONS

The present application is a national stage entry according to 35 U.S.C. § 371 of PCT application No.: PCT/EP2018/079312 filed on Oct. 25, 2018; which claims priority to German Patent Application Serial No.: 10 2017 125 237.1 filed on Oct. 27, 2017; all of which are incorporated herein by reference in their entirety and for all purposes.

TECHNICAL FIELD

The disclosure relates to a semiconductor laser array and a semiconductor laser array circuit arrangement.

BACKGROUND

Diode laser arrays are usually controlled by MOSFETs (metal-oxide-semiconductor field-effect transistors). There is a need for the internal structural design of the diode laser arrays to provide boundary conditions for the design of the control circuit.

SUMMARY

A semiconductor laser array comprises a plurality of radiation-emitting lasers, each of which is controlled by a driver. Such lasers can comprise a semiconductor layer stack with one or more pn junction regions as laser diodes.

Figure 1:
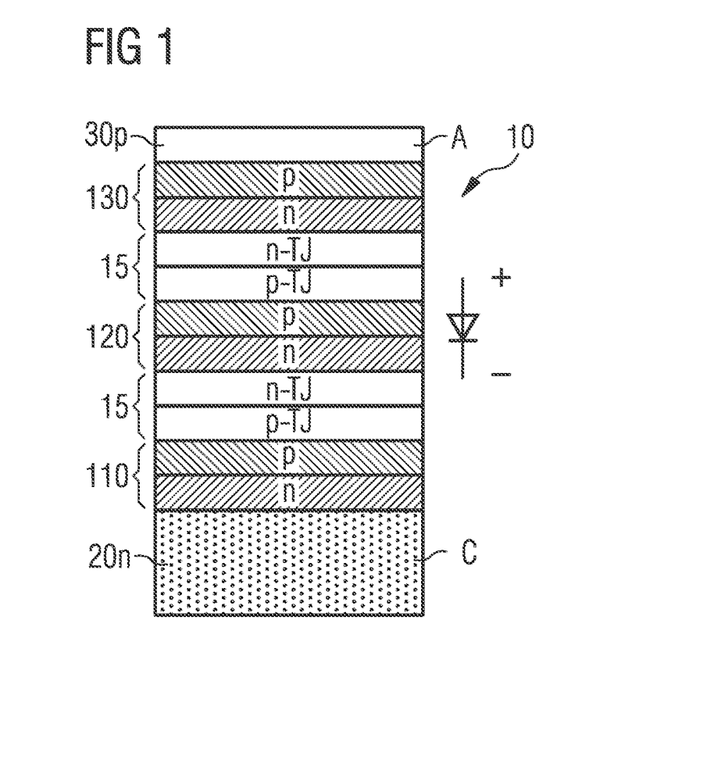
FIG. 1 shows an exemplary embodiment of a laser from a conventional semiconductor laser array.

FIG. 1 shows an exemplary embodiment of a conventional laser with a semiconductor layer stack on an n-doped substrate 20n based on GaAs. The laser comprises three pn junction regions 110, 120, 130, each with a p-doped layer p and an n-doped layer n. The n-doped layers n of the pn junction regions 110, 120, 130 face the substrate 20n; the p-doped layers p face away from it. A tunnel diode 15 with an n- and a p-doped tunnel diode layer n-TJ, p-TJ is arranged between the pn junction regions 110, 120, 130. At the top of the semiconductor layer stack a p-doped contact layer 30p is arranged as an anode A. A conventional semiconductor laser array comprises a plurality of these semiconductor layer stacks, with the substrate 20n serving as a common cathode C. This is also illustrated by the circuit symbol next to the laser 10 in FIG. 1.

Figure 2:
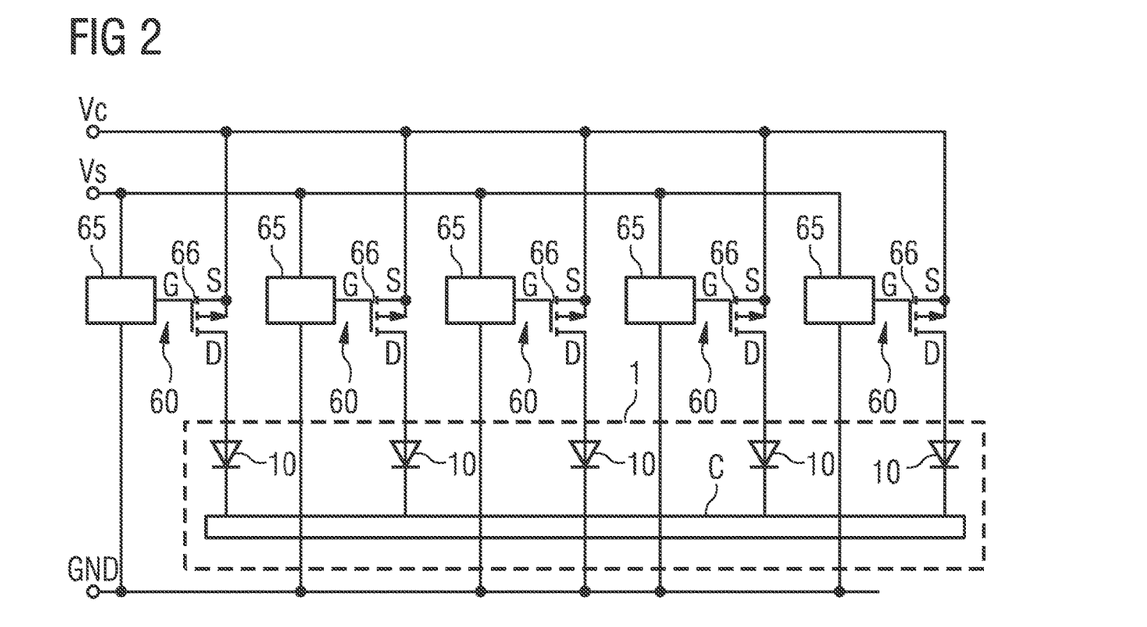
FIGS. 2 and 3 show conventional exemplary embodiments of semiconductor laser array circuit arrangements.

FIG. 2 shows a conventional semiconductor laser array circuit arrangement comprising a plurality of lasers 10 in an array 1 with a common cathode C and one driver 60 for each laser 10 as described in connection with FIG. 1. The driver 60 comprises a p-MOSFET 66 with drain, source and gate terminals D, S, G and a MOSFET driver 65 connected to the gate terminal G. The MOSFET driver 65 is connected to a control potential Vs and a reference potential GND and allows the MOSFET 66 to be controlled via its gate terminal G depending on the applied voltage. The anodes of the lasers 10 are electrically connected to the drain terminal D of the MOSFET 66 controlling them. The source terminals S are connected to a supply potential Vc. This control is also called source control. The use of p-MOSFETs in the arrangement shown in FIG. 2 results in a source circuit that has the advantage of voltage and current gain. These transistors, however, have higher power dissipation and shorter switching times than n-MOSFETs due to their specific type. Their acquisition costs are higher. A high control voltage is also required. Current and voltage gain are greater than one.

The control of infrared high-power diode laser arrays of the type described above has the following technical problems. This also applies at least partially to the following arrangement in FIG. 3. A control with shorter current pulses is not feasible because of large parasitic inductances and capacitances due to long wire connections and the circuit type with its relatively large p-MOSFETs. The applied circuit types require a relatively high control voltage. This has an unfavorable effect on the control pulse form and width. Power losses are high. Geometric dimensions and weight of the circuit units are too large. This also involves relatively high costs.

Figure 3:
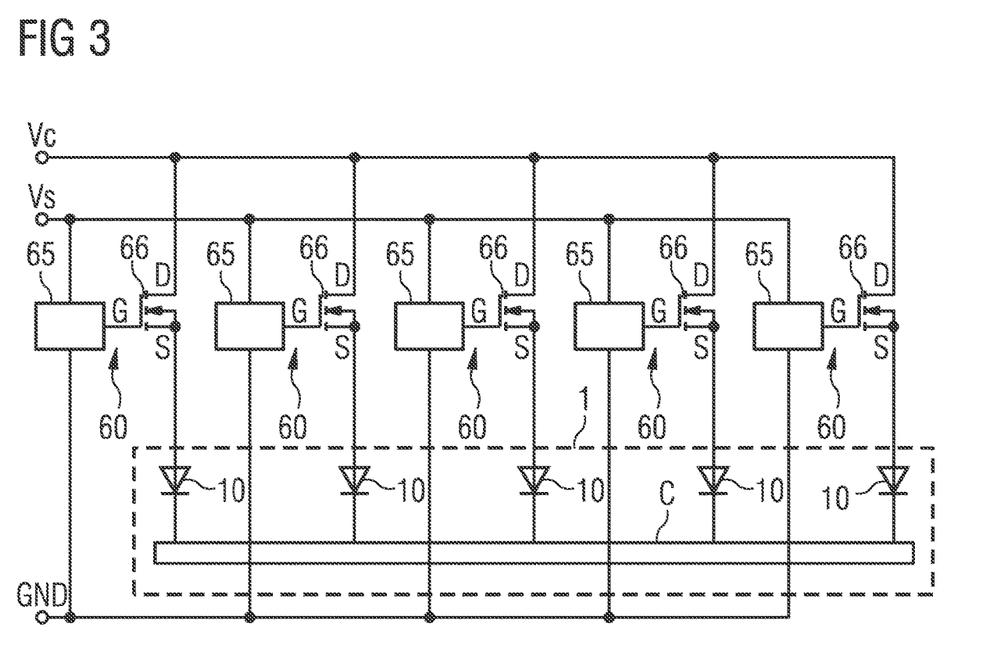

FIG. 3 shows another conventional semiconductor laser array circuit arrangement comprising a plurality of lasers with a common cathode C and a driver 60 with an n-MOSFET 66 for each laser 10, as described in connection with FIG. 1.

The anodes of the lasers 10 are electrically connected to the source terminal S of the respective MOSFET 66. The drain terminals D are connected to a supply potential Vc. The use of n-MOSFETs 66 requires a drain circuit. With n-MOSFETs 66, shorter switching times and lower power dissipation are possible. The drain circuit also has a good current gain but no voltage gain. In addition, high switching voltages are required, which makes the application of such a circuit arrangement with n-MOSFETS uninteresting.

The object is to provide an alternative semiconductor laser array circuit arrangement and a suitable semiconductor laser array.

The semiconductor laser array having a plurality of semiconductor lasers comprises a common substrate for the plurality of semiconductor lasers which is the common anode of the plurality of semiconductor lasers, wherein each semiconductor laser comprises a pn junction region between the common anode and a cathode contact layer, and the pn junction region comprises a p-doped layer and an n-doped layer, and the p-doped layer of the pn junction region faces the substrate.

The semiconductor laser array differs from conventional semiconductor laser arrays in its inner structural layer composition: The lasers have a reverse layer sequence compared to conventional lasers, so that in the layer stack of the laser the p-doped layer structure always faces the substrate and the n-doped layer structure faces the surface.

The common anode enables the individual lasers in the array to be controlled in an improved way via their cathodes by transistors. The common anode enables a source circuit with n-MOSFETs as driver circuitry. The source circuit is characterized by a voltage and current gain greater than one. The control voltage can thus be optimally implemented as a low control voltage.

The common anode allows a semiconductor laser array circuit arrangement to be provided with a semiconductor laser array as described above, the lasers of which are each controlled by a driver with an n-MOSFET. The driver comprises a source circuit of the n-MOSFET in which a drain contact of the n-MOSFET is electrically conductively connected to the cathode contact layer of one of the semiconductor lasers and a source contact of the n-MOSFET is electrically conductively connected to a reference potential. The common anode is connected to a supply potential.

Due to the use of n-MOSFETs, the circuit design requires less space and has a lower weight. This allows shorter switching wire connections. The costs are lower due to the space-saving design. Interference from parasitic inductances and capacitances is lower. Shorter rise and fall times for the control pulses are also possible compared to conventional circuit arrangements. Power loss is reduced. It is possible to use n-GaN MOSFETs, which are characterized by even shorter switching times than n-Si MOSFETs.

In a laser, the pn junction region may be comprised by a plurality of pn junction regions, the p-doped layers of the pn junction regions each facing the substrate. A tunnel diode is arranged between two adjacent pn junction regions. In other words, a tunnel diode, also known as a tunnel contact, is always installed between the individual lasers in the stack to achieve an ohmic transition between the lasers.

The substrate can be an n-doped substrate or a p-doped substrate. In the former case, a tunnel diode is arranged between the n-doped substrate and the adjacent pn junction region.

The n-doped substrate has advantages over the p-doped substrate. The specific resistance of the material is approximately 15 times lower. The availability of p-doped substrates is not very good.

The cathode contact layer can be n-doped or p-doped. In the latter case a tunnel diode is arranged between it and the adjacent pn junction. Doping level and thickness of the cathode contact layer can be arbitrary in both cases.

In one embodiment, the semiconductor laser comprises in each case a semiconductor layer stack on the substrate. The semiconductor layer stack comprises: the n-doped layer arranged above the p-doped layer as the pn junction region and a p-doped tunnel diode layer arranged above an n-doped tunnel diode layer forming the tunnel diode. The four layers are arranged such that the n-doped layer faces the n-doped tunnel diode layer and/or that the p-doped layer faces the p-doped tunnel diode layer.

The semiconductor lasers are separated from each other by trenches. The trenches can be at least partially filled with optically insulating material to reduce crosstalk between the lasers.

BRIEF DESCRIPTION OF THE DRAWINGS

In the following, the semiconductor laser array described herein are explained in more detail in conjunction with non-limiting embodiments and the associated figures.

Identical, similar or similar-looking elements are provided with the same reference signs in the figures. The figures and the proportions of the elements depicted in the figures relative to each other are not to be considered as true to scale. Rather, individual elements may be displayed in an exaggeratedly large format for better presentation and/or comprehensibility.

DETAILED DESCRIPTION

Figure 4:
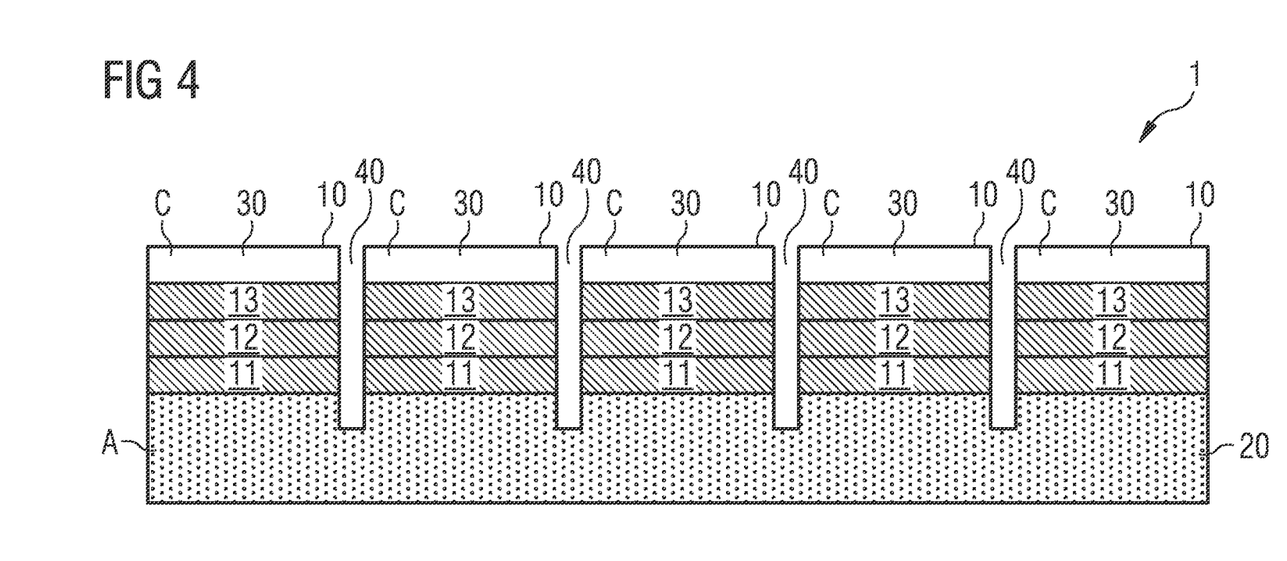
FIG. 4 shows an exemplary embodiment of a semiconductor laser array.

FIG. 4 schematically shows a semiconductor laser array 1 with a plurality of radiation-emitting lasers 10. Such an array 1 can be an infrared high power diode laser array with radiation in the infrared range. Alternative exemplary embodiments emit light in the visible or ultraviolet range.

Five lasers 10 arranged side by side are shown as an example. The lasers 10 are diode lasers with three laser diodes arranged one above the other, i.e. vertically stacked, and connected in series, each forming a laser region 11, 12, 13.

The semiconductor laser array 1 is constructed as a semiconductor layer stack on a common substrate 20, for example based on GaAs, by means of which a common contacting of the lasers 10 is made possible. The lasers are separated by trenches 40. A contact layer 30 is arranged on top of each laser. A voltage can be applied between the contact layer 30 and the common substrate 20 to control the laser 10.

The geometrical dimensions of a semiconductor laser array 1 and the lasers 10 therein can be selected arbitrarily. Only the specified requirements for the laser properties, in particular the desired radiation emission, must be met. The number of individual lasers 10 in the array 1, which are generated by material recesses, is freely selectable. The number of stacked laser diodes in each laser 10 is freely selectable. This provides sufficient degrees of freedom for the design of an array 1 with given array properties.

In this exemplary embodiment, the common substrate 20 is the common anode A of the lasers 10, and the contact layers 30 are the cathodes of the individual lasers 10.

The semiconductor layer stacks for each laser can be produced by growing epitaxial layers on the substrate 20, so that the layers for the later lasers 10 are produced parallel and simultaneously. The subsequent production of the individual lasers 10 in the array 1 from the layer sequence can be done in different ways. In one exemplary embodiment, the lasers 10 are formed by poorly conducting vertical surfaces, which are created by diffusing material into the laser layers down to the substrate. By sawing, optical burning or etching, separation trenches 40 that are a few micrometers wide can be formed between the lasers 10 and can optionally be filled with optically insulating material to reduce crosstalk. Alternative methods for the production of high-resistance or non-conductive or poorly conductive layers between the lasers 10 are conceivable.

Figure 5:
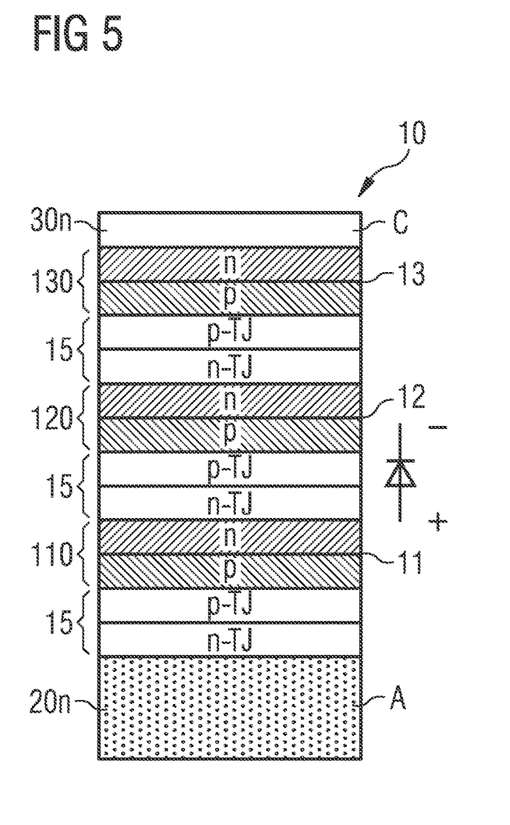
FIGS. 5, 6, 7 and 8 show exemplary embodiments of a laser from the semiconductor laser array.

FIG. 5 shows an exemplary embodiment of a laser from the semiconductor laser array in FIG. 4.

The common substrate is an n-doped substrate 20n based on GaAs, which serves as a common anode A. This is also illustrated by the circuit symbol next to the laser 10.

The laser 10 comprises a first laser region 11 with a pn junction region 110, a second laser region 12 with a pn junction region 120, and a third laser region 13 with a pn junction region 130, each pn junction region 110, 120, 130 comprising a p-doped layer p and an n-doped layer n, between which an active layer for radiation emission is sandwiched. The p-doped layers p of the pn junction regions 110, 120, 130 face the substrate 20n. The n-doped layers n of the pn junction regions 110, 120, 130 face away from the substrate 20n.

A tunnel diode 15 is provided between the substrate 20n and the first laser region 11, as well as between the first and second laser regions 11, 12 and between the second and third laser regions 12, 13. Each tunnel diode 15 has a p- and an n-doped tunnel diode layer p-TJ, n-TJ.

The lasers 10 comprise a layer sequence so that in the laser regions 11, 12, 13 in the stack the p-doped layer structure p always faces the substrate 20n and the n-doped layer structure n faces the surface. A tunnel diode 15, also known as a tunnel contact, is always provided between the individual laser regions 11, 12, 13 in the stack to form a low-resistance transition between the laser regions 11, 12, 13.

The layer sequence of the semiconductor layer stack of the laser 10 on a common n-doped substrate 20n is as follows in ascending order: on the n-doped substrate 20n, the n-doped tunnel diode layer n-TJ and the p-doped tunnel diode layer p-TJ are arranged, followed by the p-doped layer p and the n-doped layer n of the first pn junction region 110, then the n-doped tunnel diode layer n-TJ and the p-doped tunnel diode layer p-TJ, followed by the p-doped layer p and the n-doped layer n of the second pn junction region 120, then the n-doped tunnel diode layer n-TJ and the p-doped tunnel diode layer p-TJ, followed by the p-doped layer p and the n-doped layer n of the third pn junction region 130, and on top of this the n-doped cathode contact layer 30n. The active layers of the pn junction regions 110, 120, 130 were not mentioned. Further intermediate layers are optional.

Figure 6:
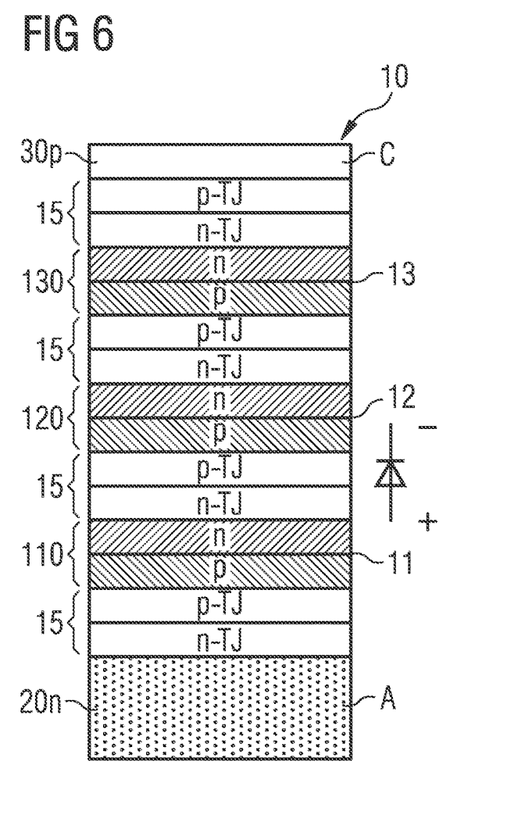

FIG. 6 shows another exemplary embodiment of a laser 10 from the semiconductor laser array 1 in FIG. 4. To avoid repetition, only the differences to the exemplary embodiment shown in FIG. 5 are described.

In this exemplary embodiment a p-doped cathode contact layer 30p is provided, between which and the third pn junction region 130 a tunnel diode 15 with an n- and a p-doped tunnel diode layer n-TJ, p-TJ is arranged. The n-doped tunnel diode layer n-TJ faces the third laser region 130. The p-doped tunnel diode layer p-TJ faces the cathode contact layer 30p. This exemplary embodiment enables standardized production if, in accordance with conventional design, a p-doped top contact surface 30 is specified.

Figure 7:
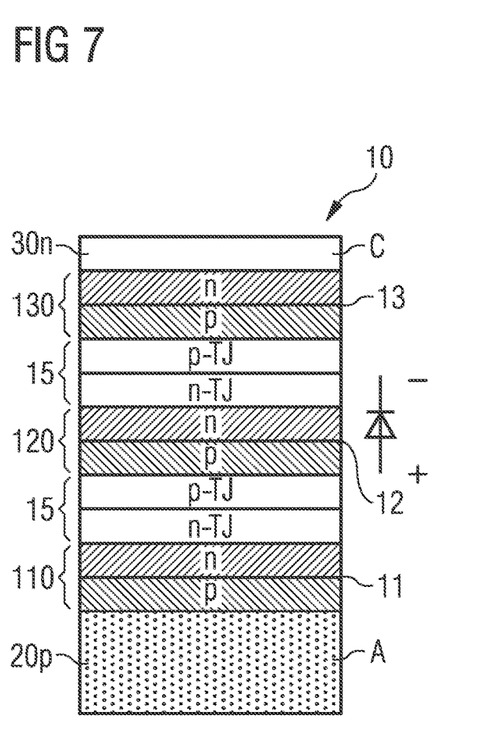

FIG. 7 shows another exemplary embodiment of a laser 10 from the semiconductor laser array 1 in FIG. 4. To avoid repetition, only the differences to the exemplary embodiment shown in FIG. 5 are described.

In this exemplary embodiment a p-doped substrate 20p is provided as a common anode A. This eliminates the need for the tunnel diode 15 between the substrate 20p and the first laser region 11.

The layer sequence of the semiconductor layer stack on the common p-doped substrate 20p is as follows in ascending order: on the p-doped substrate 20p, the p-doped layer p and the n-doped layer n of the first pn junction region 110 are arranged, then the n- and the p-doped tunnel diode layers n-TJ, p-TJ, followed by the p- and the n-doped layers p, n of the second pn junction region 120, then the n- and the p-doped tunnel diode layers n-TJ, p-TJ, followed by the p- and the n-doped layers p, n of the third pn junction region 130, and on top of this the n-doped cathode contact layer 20n. The active layers of the pn junction regions 110, 120, 130 were not mentioned. Further intermediate layers are optional.

Figure 8:
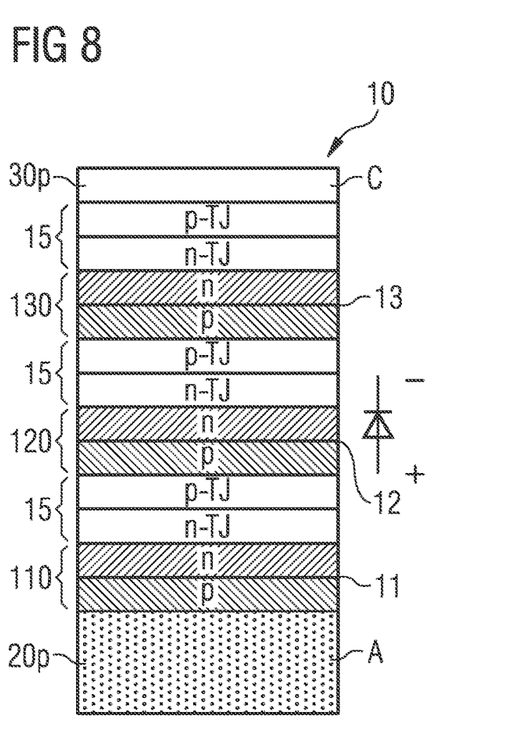

FIG. 8 shows another exemplary embodiment of a laser 10 from the semiconductor laser array 1 in FIG. 4. To avoid repetition, only the differences to the exemplary embodiment shown in FIG. 6 are described.

In this exemplary embodiment a p-doped substrate 20p is provided as a common anode. Therefore the tunnel diode between the substrate 20p and the first laser region 11 is dispensable and missing.

The exemplary embodiments described in FIGS. 5 to 8 illustrate that semiconductor laser arrays 1 with a common anode A can be produced with both n- and p-doped substrates 20n, 20p.

The cathode contact layer 30n, 30p can have the following variants: Either it is n-doped with any doping level and thickness or p-doped with any doping level and thickness with a tunnel diode 15 below.

Figure 9:
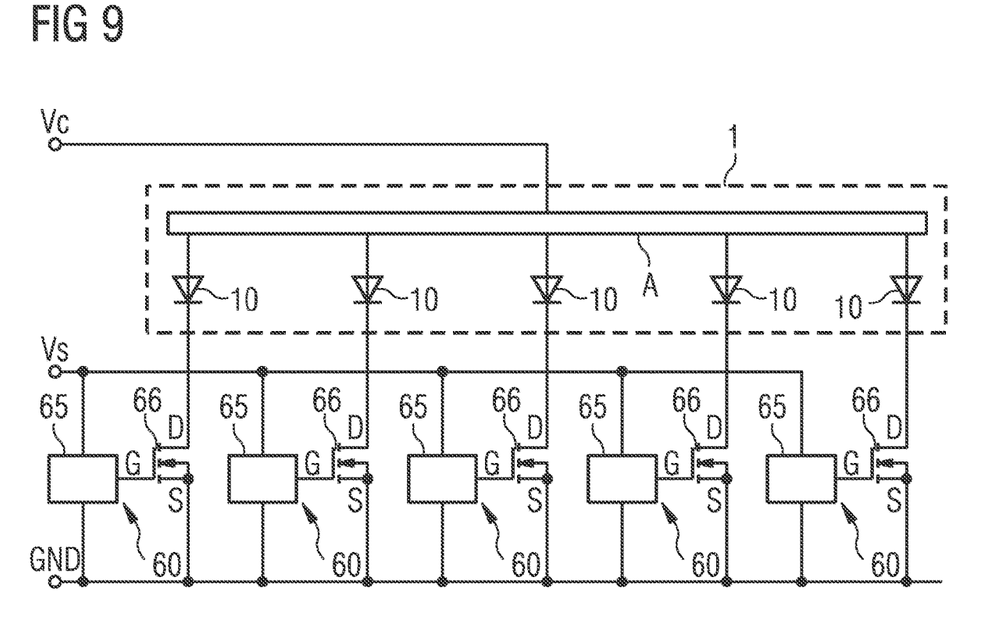
FIG. 9 shows an exemplary embodiment of a semiconductor laser array circuit arrangement.

FIG. 9 shows an exemplary embodiment of a semiconductor laser array circuit arrangement for controlling the exemplary embodiments of semiconductor laser arrays 1 described in FIGS. 4 to 8 with a common anode A for the laser regions 10 of the semiconductor laser array 1.

The semiconductor laser array circuit arrangement has one driver 60 for each laser 10. The driver 60 comprises an n-MOSFET 66 with drain, source and gate terminals D, S, G and a MOSFET driver 65 connected to the gate terminal G. The MOSFET driver 65 is connected to a control potential Vs and a reference potential GND. Depending on the applied voltage it allows to control the MOSFET 66 via its gate terminal G and to influence its radiation in a desired way.

The common anode A is connected to the supply potential Vc. The cathodes of the lasers 10 are electrically connected to the drain terminal D of the MOSFET 66 controlling them. The source terminals S are connected to the reference potential GND. This control is also known as source control, which provides the best possible pulse control for the diode laser array 1. The required control voltage Vs is lower than with conventional arrangements. Voltage and current gain are greater than one.

The semiconductor laser array circuit arrangement may be integrated so as to comprise the semiconductor laser array 1 and also at least parts, in particular the n-MOSFETS 66, of the drivers 60. Due to the reduced space requirements of the n-MOSFETs 66, the interconnect structures between the n-MOSFETs 66 and the lasers 66 are short, reducing unwanted circuit and conductivity effects.

The features of the exemplary embodiments can be combined. The invention is not limited by the description by means of the exemplary embodiments. Rather, the invention comprises any new feature as well as any combination of features, which includes in particular any combination of features in the claims, even if this feature or combination itself is not explicitly specified in the claims or exemplary embodiments.

REFERENCE SIGNS 1 semiconductor laser array
10 semiconductor laser
11, 12, 13 laser regions
15 tunnel diode
20, 20n, 20p substrate
30, 30n, 30p contact layer
40 trench
60 driver
65 MOSFET driver
66 MOSFET
110, 120, 130 pn junction region
A anode
C cathode
G, S, D gate, source, drain terminal
n n-doped layer
n-TJ n-doped tunnel diode layer
p p-doped layer
p-TJ p-doped tunnel diode layer
Vc supply potential
Vs control potential
GND reference potential

The invention claimed is:
1. A semiconductor laser array comprising:
a plurality of semiconductor lasers;

a common substrate configured as a common anode of said plurality of semiconductor lasers;

wherein each semiconductor laser comprises a pn junction region between the common anode and a cathode contact layer, and wherein the pn junction region comprises a p-doped layer and an n-doped layer, and wherein the p-doped layer faces the substrate.

2. The semiconductor laser array according to claim 1, wherein the pn junction region of at least one semiconductor laser of the plurality of semiconductor lasers comprises a plurality of pn junction regions, and wherein a tunnel diode is arranged between two adjacent pn junction regions.

3. The semiconductor laser array according to claim 1, wherein the substrate is an n-doped substrate.

4. The semiconductor laser array according to claim 3, wherein a tunnel diode is arranged between the n-doped substrate and the adjacent pn junction region.

5. The semiconductor laser array according to claim 1, wherein the substrate is a p-doped substrate.

6. The semiconductor laser array according to claim 1, wherein the cathode contact layer is n-doped.

7. The semiconductor laser array according to claim 1, wherein each semiconductor laser of the plurality of semiconductor lasers comprises a semiconductor layer stack arranged on the substrate, wherein the semiconductor layer stack comprises:

the pn junction where the n-doped layer is arranged above the p-doped layer, and a p-doped tunnel diode layer arranged above an n-doped tunnel diode layer, wherein the n-doped layer faces the n-doped tunnel diode layer, the p-doped layer faces the p-doped tunnel diode layer, or combinations thereof.

8. The semiconductor laser array according to claim 7, wherein the plurality of semiconductor lasers are separated from each other by trenches.

9. A semiconductor laser array circuit arrangement comprising a semiconductor laser array according to claim 1, wherein each semiconductor laser of the plurality of semiconductor lasers are configured to be controlled by a driver with an n-MOSFET.

10. The semiconductor laser array circuit arrangement according to claim 9, wherein the driver comprises a source circuit of the n-MOSFET; wherein the n-MOSFET comprises a drain contact and a source contact wherein the drain contact is electrically conductively connected to the cathode contact layer of one semiconductor laser of the plurality of the semiconductor lasers; wherein the source contact is electrically conductively connected to a reference potential.

11. The semiconductor laser array circuit arrangement according to claim 10, wherein the common anode is connected to a supply potential.

12. A semiconductor laser array comprising:

a plurality of semiconductor lasers; and a common substrate configured as a common anode of said plurality of semiconductor lasers;

wherein each semiconductor laser comprises a pn junction region between the common anode and a cathode contact layer, wherein the pn junction region comprises a p-doped layer and an n-doped layer, and wherein the p-doped layer of the pn junction region faces the substrate, and wherein the cathode contact layer is p-doped and a tunnel diode is arranged between the cathode contact layer and the adjacent pn junction region.

* * * * *